(12) United States Patent
Yamazaki et al.

(10) Patent No.: US 7,842,205 B2
(45) Date of Patent: Nov. 30, 2010

(54) MANUFACTURING METHOD BY TREATING SUBSTRATE INTRODUCED INTO TREATMENT APPARATUS FROM TRANSFER CONTAINER

(75) Inventors: Shunpei Yamazaki, Setagaya (JP); Noriyuki Matsuda, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 579 days.

(21) Appl. No.: 10/740,417

(22) Filed: Dec. 22, 2003

(65) Prior Publication Data

US 2004/0130073 A1 Jul. 8, 2004

(30) Foreign Application Priority Data

Dec. 26, 2002 (JP) ............................. 2002-378734

(51) Int. Cl.
  B29C 73/00 (2006.01)
  G06Q 30/00 (2006.01)
  B65D 25/14 (2006.01)
  B65D 85/00 (2006.01)

(52) U.S. Cl. ...................... 264/36.15; 264/39; 705/330; 705/340; 220/495.01; 220/23.87; 220/528; 220/529; 206/307; 206/307.1; 206/710

(58) Field of Classification Search ....................... None
See application file for complete search history.

(56) References Cited

U.S. PATENT DOCUMENTS 4,532,970 A * 8/1985 Tullis et al. .............. 414/217.1
4,709,834 A * 12/1987 Mortensen et al. .......... 220/326
4,817,795 A * 4/1989 Kos ............................. 206/711
5,255,783 A * 10/1993 Goodman et al. ........... 206/711
5,273,159 A * 12/1993 Gregerson ................... 206/711
5,320,218 A * 6/1994 Yamashita et al. ....... 206/213.1
5,346,518 A * 9/1994 Baseman et al. ............ 96/126
5,377,476 A * 1/1995 Bohmer et al. ................ 53/255
5,429,642 A * 7/1995 Ohkuma .................... 29/25.01
5,536,128 A * 7/1996 Shimoyashiro et al. ..... 414/273

(Continued)

FOREIGN PATENT DOCUMENTS

EP        1043758        10/2000

(Continued)

*Primary Examiner*—Jeffrey Wollschlager
(74) *Attorney, Agent, or Firm*—Eric J. Robinson; Robinson Intellectual Property Law Office, P.C.

(57) ABSTRACT

The present invention provides a manufacturing method by which a substrate (typically, a TFT substrate) can be installed directly in a treatment apparatus by using a transfer container without shifting the substrate from the transfer container to another container. It is possible to use the container efficiently and transfer different substrates in size with one container. A manufacturing method in which a substrate is directly installed in an electrostatic-protected transfer container by a substrate supplier, and then the container is directly installed in a treatment apparatus by a substrate demander after transferring can be realized, thereby making it possible to transfer substrates such as a TFT substrate. A contamination of a substrate due to particles and electrostatic discharge damage of a TFT substrate can be avoided because a transferring operation is not needed. A manufacturing method in which a substrate holding portion of the container is replaced depending on the size of a substrate and different substrates in size can be transferred with one container may be employed.

28 Claims, 8 Drawing Sheets

U.S. PATENT DOCUMENTS

| | | | | |
|---|---|---|---|---|
| 5,577,621 A | * | 11/1996 | Yi | 211/41.18 |
| 5,725,100 A | * | 3/1998 | Yamada | 206/710 |
| 5,798,455 A | * | 8/1998 | Sakata et al. | 73/64.48 |
| 5,827,118 A | * | 10/1998 | Johnson et al. | 454/187 |
| 5,855,272 A | * | 1/1999 | Symons et al. | 206/213.1 |
| 6,143,619 A | * | 11/2000 | Okamura et al. | 438/398 |
| 6,491,177 B1 | | 12/2002 | Hyobu | |
| 6,521,889 B1 | * | 2/2003 | Ina et al. | 250/306 |
| 6,873,515 B2 | * | 3/2005 | Chang | 361/213 |
| 7,048,127 B2 | | 5/2006 | Hyobu et al. | |
| 7,172,981 B2 | * | 2/2007 | Kobayashi | 438/800 |
| 2002/0132047 A1 | * | 9/2002 | Yamazaki et al. | 427/255.6 |
| 2003/0172518 A1 | * | 9/2003 | Uh et al. | 29/564.2 |
| 2003/0180457 A1 | * | 9/2003 | Murakami et al. | 427/237 |
| 2005/0173296 A1 | | 8/2005 | Hyobu et al. | |

FOREIGN PATENT DOCUMENTS

| | | |
|---|---|---|
| EP | 1411006 | 4/2004 |
| JP | 10-264970 | 10/1998 |
| JP | 11-031740 | 2/1999 |
| JP | 2000-289795 | 10/2000 |
| JP | 2001-158499 | 6/2001 |
| JP | 2002-225949 | 8/2002 |
| WO | WO 02/093622 * | 11/2002 |
| WO | WO-03/010069 | 2/2003 |

* cited by examiner

Fig. 1
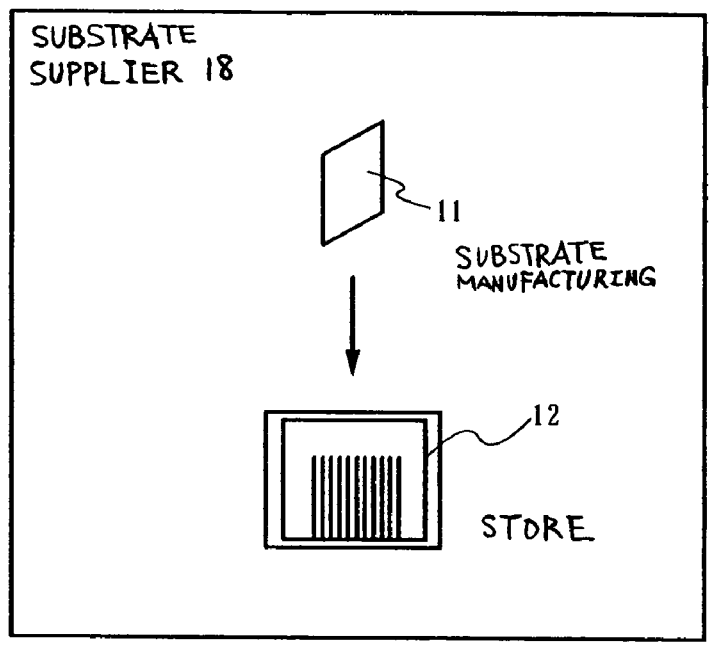
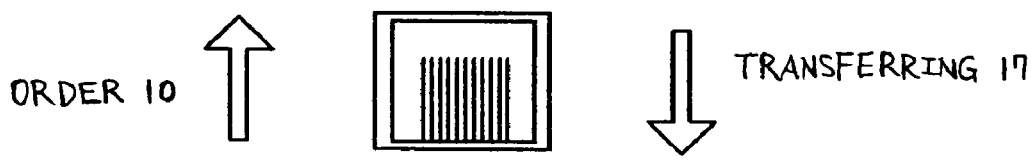
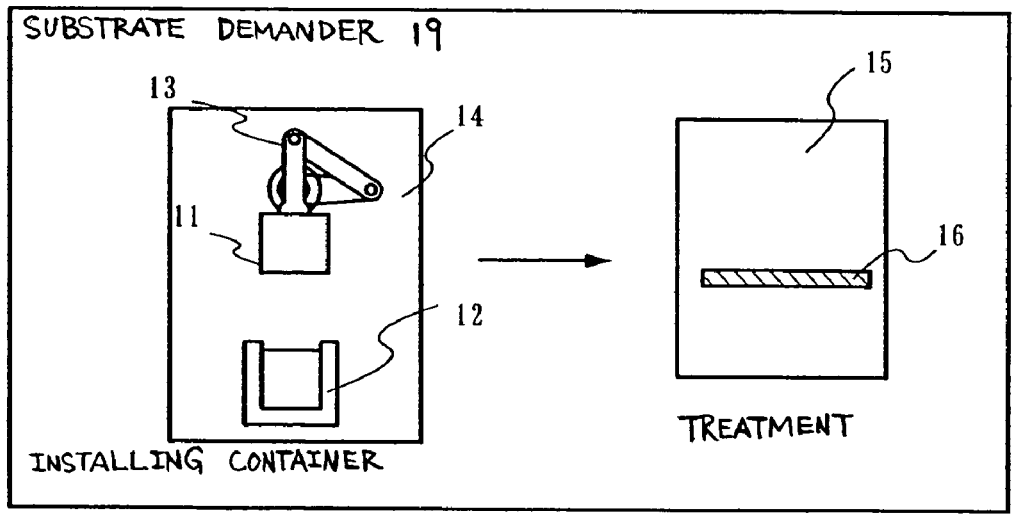

Fig. 2
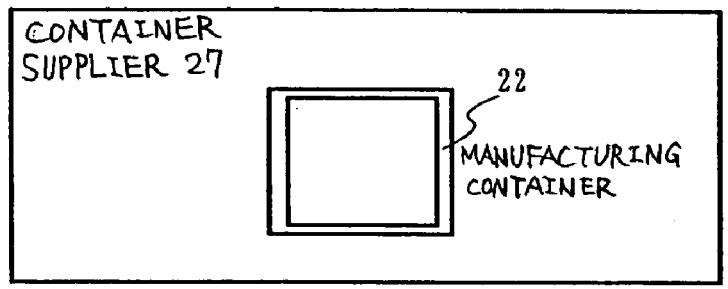
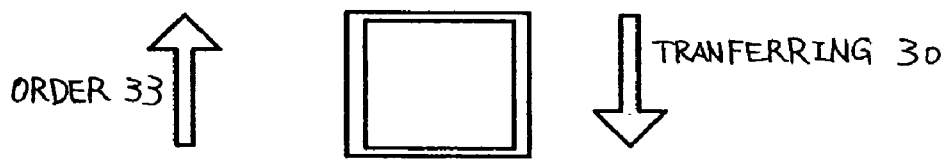
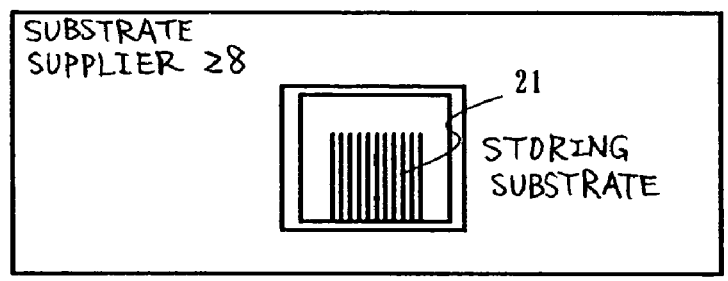
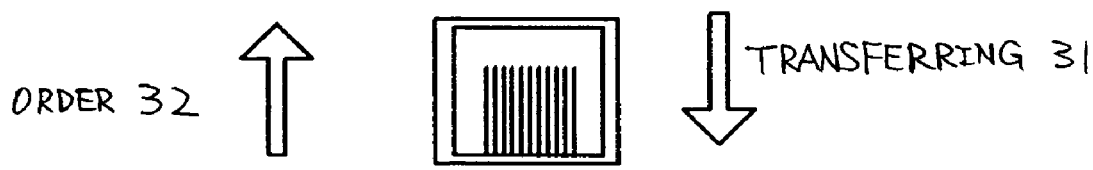
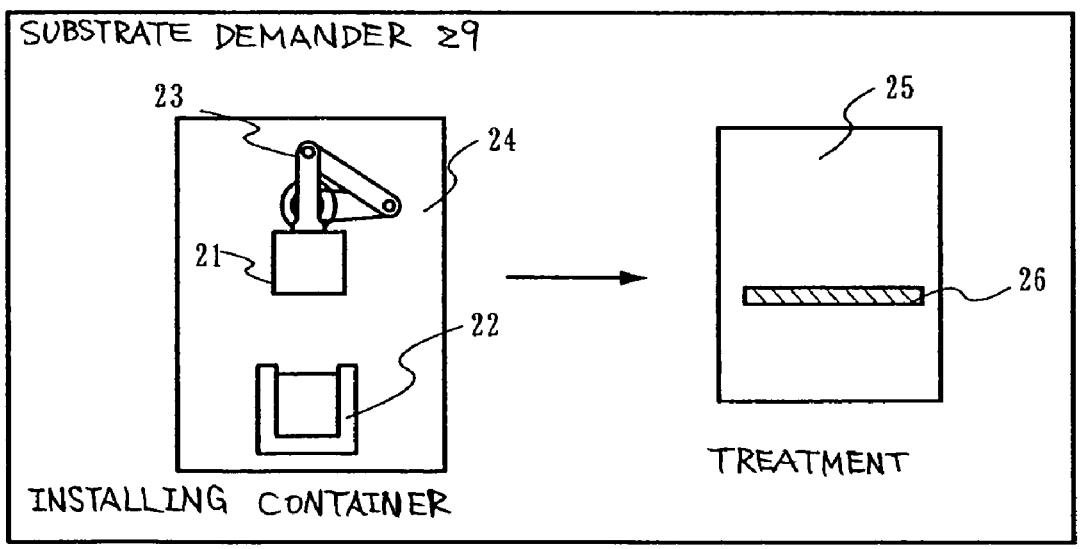

Fig. 5
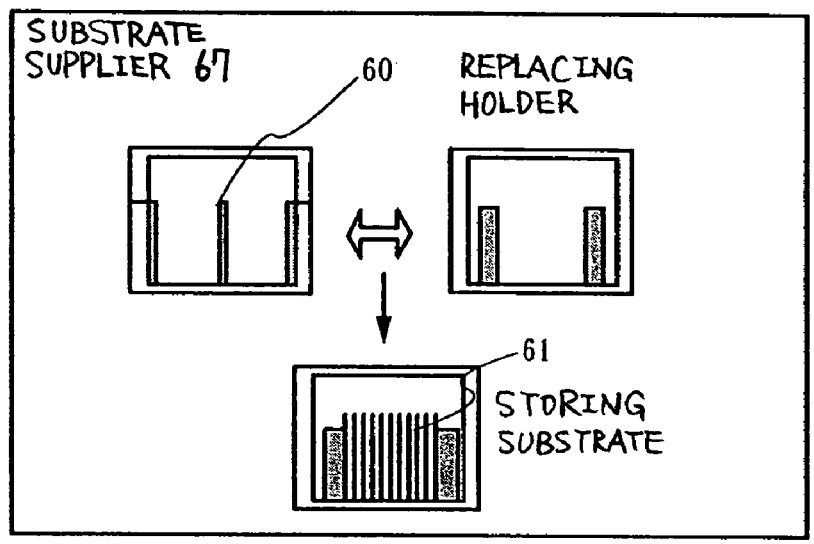
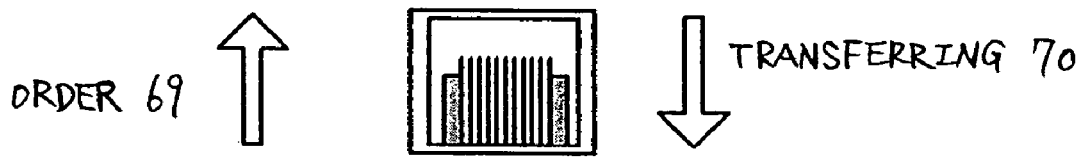
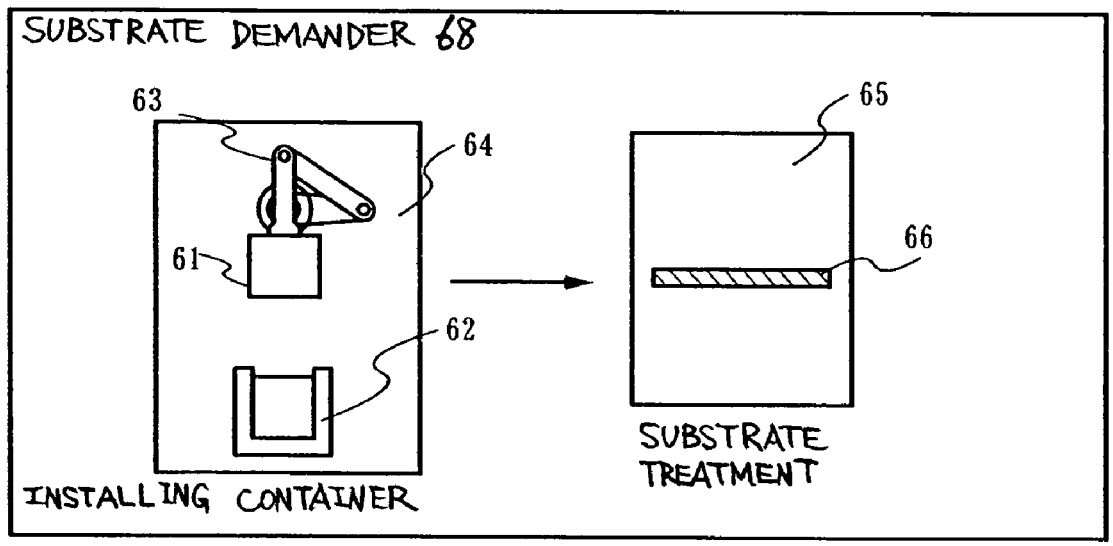

Fig. 6
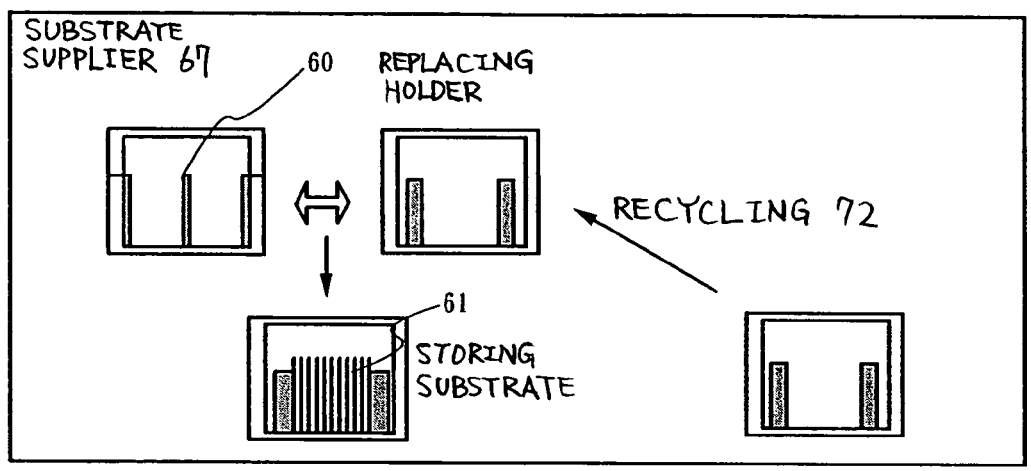
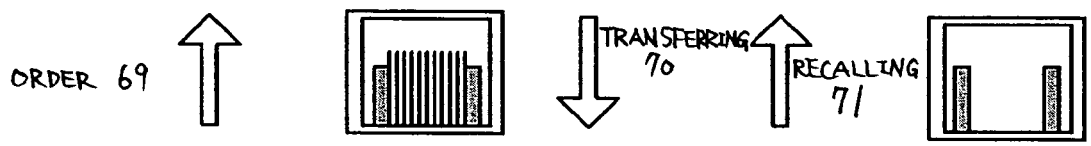
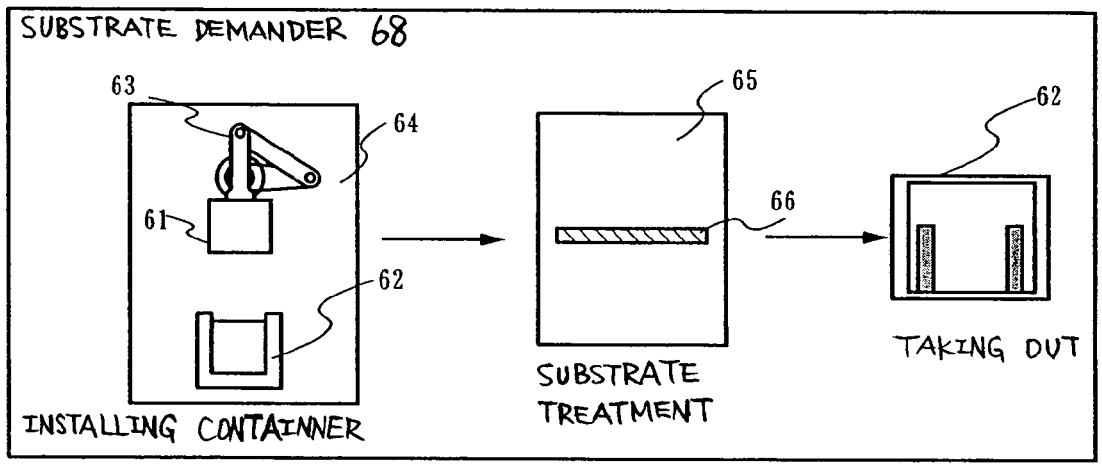

MANUFACTURING METHOD BY TREATING SUBSTRATE INTRODUCED INTO TREATMENT APPARATUS FROM TRANSFER CONTAINER

BACKGROUND OF THE INVENTION

1. Field of the Invention

The present invention relates to a manufacturing method to perform a treatment on a substrate. Particularly, the present invention relates to a manufacturing method of a display device. The present invention also relates to an operation method of a treatment apparatus, and a display device formed by the operation method. Further, the present invention relates to recycling a container for transferring a substrate.

2. Description of the Related Art

A conventional substrate transfer system is made mainly for the purpose of transferring a glass substrate or the like, not for the purpose of transferring a TFT substrate (See References 1 and 2). Nowadays, there is in general used a method by which a substrate is placed in a storage container made of styrofoam that has a good shock absorbing property and is cheap, or a container made of plastic (that is not electrostatic-protected) that is easy to recycle, or a method by which a substrate is wrapped with paper and the substrate is further packed with a packaging material (a shock absorbing material such as a cardboard).

However, according to the above described methods, a glass substrate having a uniform size, a glass coated with a film can be transferred, but a TFT substrate that has a weakness for scratches or the like cannot be transferred. When two or more kinds of substrates that are different in size are transferred, it is necessary to prepare containers, respectively, corresponding to the sizes thereof.

The glass substrate that has been stored in a container and transferred and is transferred into a container usable for an environment of a clean room (hereinafter, referred to as a clean room) with a human hand or transfer equipment in a preparation room and then, transferred into a clean room through an air shower chamber. When the conveying container can be usable for the clean room (for example, an encapsulated type container made of plastic or the like), the container is exposed to a cleaning treatment, and then, the conveying container is transferred into the clean room.

The substrate transferred into the clean room is transferred into a conveying container in the clean room with a human hand or transfer equipment, and then, from the conveying container in the clean room into a treatment apparatus. In some cases where the conveying container usable for the clean room is used, a substrate is transferred directly in a cassette box for the treatment apparatus from the conveying container.

However, according to the above described methods, there is a necessity of preparing different containers corresponding to each of the steps. Thus, a cost becomes higher and a throughput is lowered because a transferring step is required, which is a problem. Electrostatic generated in transferring, contamination of a substrate due to particles, electrostatic discharge damage of a TFT substrate device, breakage of a substrate due to a worker's mistake in transferring, etc. are also problems (Reference 1: Japanese Patent Laid-Open No. H10-264970 and Reference 2: Japanese Patent Laid-Open No. 2002-225949).

SUMMARY OF THE INVENTION

As described above, it is necessary to establish a technique for transferring a TFT substrate so that a TFT substrate can be transferred. It is also required to eliminate a transferring step performed from a step for storing a substrate till a step for setting the substrate in a load portion of a treatment apparatus, and prevent electrostatic generated in transferring, contamination of a substrate due to particles attached to the substrate in transferring, etc. Therefore, the present invention has made in view of the above described problems for the sake of solving the problems. It is an object of the present invention to provide a manufacturing method by which a labor cost or cost for automation in transferring can be reduced, decline of a process yield of lot due to a transferring mistake, electrostatic discharge damage, contamination of a substrate in transferring, or damages can be avoided improvement of the throughput, transferring various substrate in size or in kind, efficiency of storage can be realized easily.

A conventional container for storing and transferring a substrate is typically not electrostatic-protected, and is designed from the viewpoint of transferring only. However, a manufacturing method according to the present invention is a closed system in which a transferring operation to another container is not required in steps of transferring, cleaning and the like by storing a substrate directly in a conveying container which is electrostatic-protected and can be set directly to a treatment apparatus, instead of using a styrofoam container, a plastic container or the like that need be transferred into a conveying container usable for a clean room, a substrate storage container for a treatment apparatus, or the like. According to the present invention, electrostatic discharge damage in transferring a substrate, contamination of a substrate, decrease of throughput can be prevented, and it is possible to realize transferring various substrates that are different in size and TFT substrate with the same container, which is not common until now. Further, when an unused substrate is stored, the substrate can be stored in the state that the substrate is kept installed in a conveying container, instead of storing the substrate in a container for storage only. The present invention makes it possible to directly install a conveying container in various treatment apparatuses without transferring a substrate in a container for storage only, and further, to transfer different substrates in size by replacing a substrate holder within the container.

Preferably, a substrate demander that uses a treatment apparatus asks a substrate supplier that manufactures or sells a substrate to directly store a substrate in the conveying container. Cooperation between the substrate demander and the substrate supplier can realize a very efficient a transferring mode, and more efficient manufacturing method is provided by using the transferring mode according to the present invention. A plurality of substrates are transferred with one container, and installed in a treatment apparatus, wasteful steps is eliminated, and thus environmentally-friendly step can be obtained according to the manufacturing method of the present invention. Since the substrate supplier installs directly a substrate in a container, it is possible to sell a required amount of substrates, and use efficiently a glass substrate, a TFT substrate or the like that is relatively expensive. In other words, it is possible to reduce excess stock or shortage of unnecessary substrates generated in a conventional way. The present invention makes it possible to transfer a TFT substrate, although the TFT substrate cannot be transferred by a conventional method.

The operation for transferring a substrate into a conveying container in a clean room or a container usable for an apparatus from the conveying container can be avoided according to the manufacturing method of the present invention. The operation for transferring can be avoided, and therefore, damages or breakage of a substrate due to an operator's mistake in transferring can be suppressed, and generating electrostatic in transferring is avoided, thereby eliminating electrostatic discharge damage or contamination of a substrate such as a TFT substrate due to particles. In addition, a simple operation can be obtained by skipping the operation for transferring a substrate to a container usable for a manufacturing apparatus on the substrate demander's side. The simple operation is as follows: the substrate demander installs a container in which a substrate has already been installed by a substrate supplier in a treatment apparatus. Therefore, the throughput is enhanced.

According to the present invention, a manufacturing method for improving the throughput by being automated is realized. Further, a consistent closed system that is capable of preventing a substrate from being damaged can be realized.

Even if the substrate supplier provides a TFT substrate or the like that has no defects in a clean state, there is a risk of electrostatic discharge damage of a TFT substrate device or contamination of a substrate due to particles as long as a conventional operation for transferring is performed by a substrate demander. Thus, performance of a TFT substrate or a clean state of a substrate cannot be kept, and there is a limitation of the performance or keeping a quality. The substrate supplier and the substrate demander try in cooperation to avoid mixing of particles and generating of electrostatic, thereby keeping a TFT substrate device with a very high performance and a substrate state with a high quality, and manufacturing can be performed without detracting from the performance and the quality.

A structure described in this specification is generally shown in FIG. 1. A manufacturing method comprising the steps of: storing a substrate in a container and closed the container hermetically on a substrate supplier's side, transferring the container to a substrate demander from the substrate supplier, introducing the container into a treatment apparatus, taking the substrate out of the container, and arranging the substrate on the substrate demander's side; and performing a treatment on the substrate in the treatment apparatus on the substrate demander's side.

In the above-described structure, in the case where the container is provided by the substrate demander, the substrate demander is not required to manufacture the container, and the container may be outsourced. Also, in the case where the container is provided by the substrate supplier, the substrate supplier is not required to manufacture the container, and the container may be outsourced. The substrate supplier that prepares the container or the substrate demander preferably asks an apparatus manufacturer that provides the substrate demander with the treatment apparatus, to perform an operation for manufacturing the container to be installed in the treatment apparatus. The apparatus manufacturer, the substrate supplier, and the substrate demander are in cooperation with one another according to the present invention, thereby making it possible to transfer various substrates such as a TFT substrate and providing a manufacturing method for completing a display device having a high reliability using the substrate.

A structure described in this specification is generally shown in FIG. 2. A manufacturing method comprising the steps of: transferring a container from a container supplier to a substrate supplier, storing a substrate in the container and sealing the container hermetically on the substrate supplier's side, transferring the container to a substrate demander from the substrate supplier, introducing the container into a treatment apparatus, taking the substrate out of the container, and arranging the substrate on the substrate demander's side, and performing a treatment on the substrate in the treatment apparatus on the substrate demander's side.

The operation for manufacturing the container for being installed in the treatment apparatus may be provided by the substrate supplier or the substrate demander.

A structure described in this specification is generally shown in FIG. 3. A manufacturing method comprising the steps of: transferring a container from a substrate demander to a substrate supplier, storing a substrate in the container, and sealing the container hermetically on the substrate supplier's side, transferring the container to the substrate demander from the substrate supplier, introducing the container into a treatment apparatus, taking the substrate out of the container, and arranging the substrate on the substrate demander's side, and performing a treatment on the substrate in the treatment apparatus on the substrate demander's side.

A manufacturing method that is described as follows may be employed. Namely, when all of the substrates stored in the container are not used, and the substrate such as the TFT substrate that is not used in the container is left, the container is used as a storage container and the substrates therein can be used just when they are needed.

A structure described in this specification is generally shown in FIG. 4. A manufacturing method comprising the steps of: transferring a container from a container supplier to a substrate supplier, storing a substrate in the container, and sealing the container hermetically on the substrate supplier's side, transferring the container to a substrate demander from the substrate supplier, introducing the container into a treatment apparatus, taking the substrate out of the container, and arranging the substrate on the substrate demander's side, performing a treatment on the substrate in the treatment apparatus on the substrate demander's side, taking the container out of the treatment apparatus on the substrate demander's side and transferring the container to the substrate supplier, and storing the substrate in the container and recycling the container on the substrate supplier's side.

In each of the above-described structures, the substrate is stored in the container in a clean room and installed in the treatment apparatus without being exposed to air. Without being exposed to air, attachment of particles to the substrate and generation of electrostatic are prevented. When the substrate is a TFT substrate in the present invention, the substrate is preferably stored in the atmosphere where electrostatic is eliminated by a neutralization apparatus such as an ionizer. The contamination of the substrate and the container is preferably prevented as much as possible, since the substrate is directly stored in the container that will be installed in the treatment apparatus and transferred, according to the present invention. If electrostatic discharge damage of the TFT device is caused by the attachment of particles or generation of electrostatic in the substrate and the substrate is installed in the treatment apparatus, there is a risk of contaminating the treatment apparatus and an environment in a clean room, or generating defects of the substrate itself.

In each of the above-described structures, the treatment apparatus includes one chamber or more treatment chambers for performing various treatments on the substrate, and a load portion for taking out the substrate from the container. The treatment apparatus can be usable for almost all treatment apparatus such as cleaning equipment, decoupling equipment, a UV cleaner, deposition apparatus, CVD apparatus, and sputtering apparatus. Specifically, the substrate stored in the container may be introduced into a treatment chamber, and arranged in a desired position and treatment may be performed. It goes without saying that these operations can be all conducted by a robot and automated. The container may be set in the load portion that is a chamber style and can be drawn the vacuum and the vacuum may be drawn in the load portion to take out the substrate from the container in vacuum.

In each of the above-described structures, the container is not limited particularly. The container is preferably made of a plastic coated with a conductive substance, a conductive plastic, or the like for avoiding damages due to electrostatic to the substrate and making the container light in weight, and manufacturing the container at a lower cost. Alternatively, the container may be made of the plastic coated with a conductive substance, or metal instead of the conductive plastic. The container is a container that can be hermetically sealed with a lid attached thereto.

In each of the above-described structures, the container is not limited particularly. However, the container preferably has a light blocking effect.

In each of the above-described structures, cleaning for the container is preferably conducted by the substrate supplier before the container is stored.

In each of the above-described structures, the container is not limited particularly. A substrate holding portion (hereinafter, referred to as a substrate holder) within the container is made to be replaceable, and a substrate holder that can be replaced depending on the size of a substrate is prepared, thereby transferring various substrates that are different in size with one container, and reducing the cost.

In each of the above-described structures, the container is preferably packed with a packaging material such as a clean vinyl in order to avoid contamination of the container when the container is hermetically sealed and transferred.

A structure described in this specification is generally shown in FIG. 5. A manufacturing method comprising the steps of: transferring a container from a container supplier to a substrate supplier, replacing a substrate holder of the container depending on a size of a substrate to be stored on the substrate supplier's side, storing the substrate in the container whose substrate holder is replaced, transferring the container to the substrate demander from the substrate supplier, introducing the substrate into a treatment apparatus on the substrate demander's side, and performing a treatment on the substrate in the treatment apparatus on the substrate demander's side.

In the above-described structure, when substrates that are the same in size are transferred, it is not required to replace the substrate holder within the container, and it is possible that an appropriate response is efficiently made depending on the situation.

In each of the above-described structures, the container is a box (cassette box) including the substrate holder and a cassette box that can be hermetically sealed with a lid attached thereto. Further, in each of the above-described structures, the container is not limited particularly. The container is preferably made of a plastic coated with a conductive substance, a conductive plastic, or the like for avoiding damages due to electrostatic to the substrate and making the container light in weight, manufacturing the container at a lower cost. Alternatively, the container may be made of the plastic coated with a conductive substance, or metal instead of the conductive plastic.

In each of the above-described structures, the treatment apparatus is a treatment apparatus including a load portion as an example is shown in FIG. 8.

In the present specification, the cassette box is the container described above.

FIG. 8 shows briefly a state in which a substrate is installed in a load portion of substrate cleaning equipment as a representative example. The substrate cleaning equipment includes a load portion, an unload portion, and a substrate cleaning portion. A substrate holder is provided with a holding portion for holding a substrate (not shown in the figure), and the load portion and the unload portion are provided with a transfer robot. The cleaning equipment includes one portion or more cleaning portions.

In the above-described structure, the substrate is a glass substrate, a TFT substrate, an opposite substrate, a plastic substrate, or an opposite substrate including a color filter.

An example in which the present invention is mainly applied to the case where a substrate is transferred into and installed in a treatment apparatus such as cleaning equipment. However, the present invention can be applied to the case of transferring and storing a manufactured display device. That is, a holder large enough to hold both the substrate and the display device may be installed in a container and a manufactured display device may be stored in the container.

A structure described in this specification is generally shown in FIG. 6. The structure comprising the steps of: transferring a container from an apparatus manufacturer to a substrate supplier, replacing a substrate holder of the container depending on a size of a substrate to be stored on the substrate supplier's side, storing the substrate in the container whose substrate holder is replaced, transferring the container to a substrate demander from the substrate supplier, introducing the substrate into a treatment apparatus on the substrate demander's side, performing a treatment on the substrate in the treatment apparatus on the substrate demander's side, taking the container out of the treatment apparatus on the substrate demander's side, and transferring the container to the substrate supplier, selecting and replacing the substrate holder of the container again depending on the size of the substrate, and storing the substrate in the container on the substrate supplier's side.

BRIEF DESCRIPTION OF THE DRAWINGS

In the accompanying drawings:

FIG. 1 shows Embodiment Mode 1;
FIG. 2 shows Embodiment Mode 2;
FIG. 5 shows Embodiment Mode 5;
FIG. 6 shows Embodiment Mode 6.

DETAILED DESCRIPTION OF THE PREFERRED EMBODIMENTS

Embodiment Mode

Figure 3:
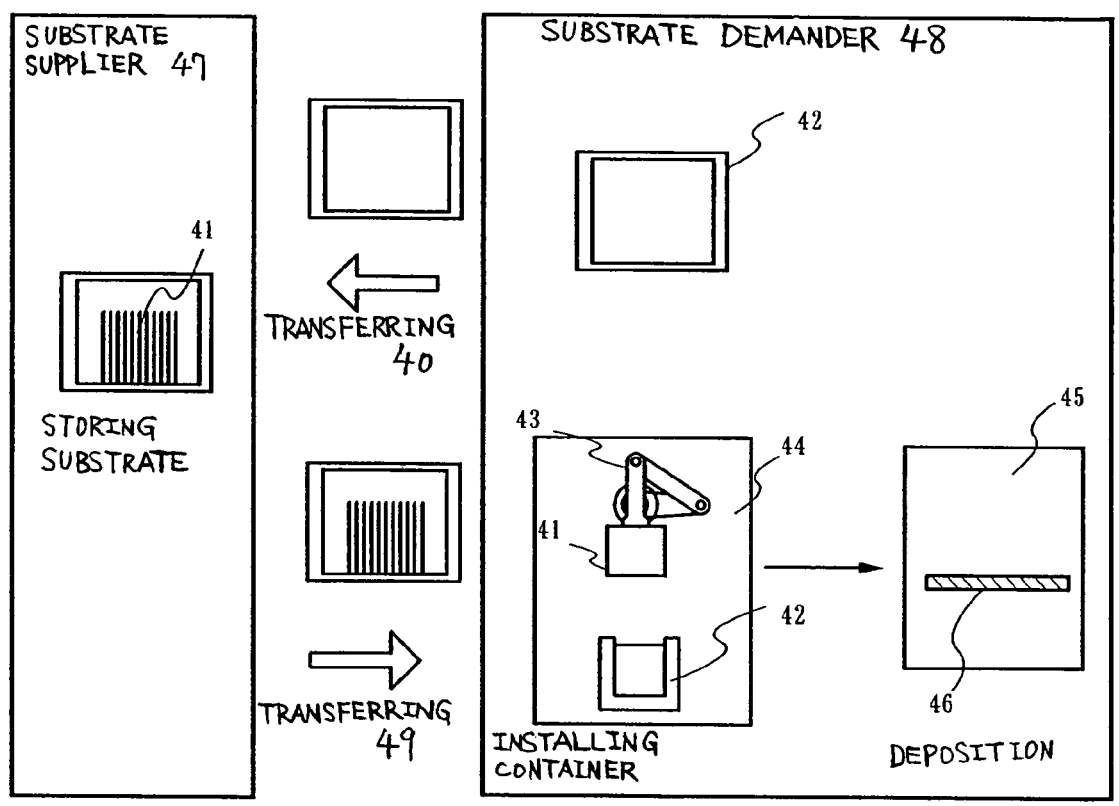
FIG. 3 shows Embodiment Mode 3.

Embodiment Modes of the present invention are described hereinafter with reference to Figures.

Embodiment Mode 1

FIG. 1 shows a manufacturing method according to the present invention. Reference number 11 denotes a substrate, 12 denotes a container (substrate cassette box) in FIG. 1. 18 denotes a substrate supplier that manufactures a glass substrate, a TFT substrate, an opposite substrate, a plastic substrate and the like. 19 denotes a substrate demander that has a treatment apparatus and manufactures a display device (typically, a production plant).

A manufacturing flow of the present invention is described hereinafter. The substrate demander 19 places an order 10 for a container with the substrate supplier 18. The substrate supplier 18 prepares the container according to the order 10. The substrate supplier stores the substrate 11 in the container 12 in a clean room while taking extra care to electrostatic and attachment of particles (such as metal particles or dusts). After that, the substrate supplier 18 preferably packs the container with the packaging material such as vinyl in the clean room so that extra impurities may not be attached to the outside and inside of the container. The packaging is preferably performed in the clean room. It is noted that the container 12 and the packaging material are preferably cleaned before the substrate is stored.

The container 12 is directly installed in a load portion in a later step for being installed in a treatment apparatus according to the present invention. And the packaging material is preferably removed before the container is transferred into the clean room.

Then, a first container 12 is transferred from the substrate supplier 18 to the substrate demander 19 (the transferring is denoted by 17).

The packaging material of the container is removed in a preparation room and the container is transferred into the clean room. A lid is taken off the container and the container is directly installed in a load portion 14 of the treatment apparatus after the container is transferred into the treatment apparatus. The substrate 11 is taken out of the container 12 by using a robot arm 13 of the treatment apparatus after the installing, and the substrate can be installed in an apparatus treatment chamber 15.

A substrate treatment 16 such as cleaning is performed in the treatment chamber 15.

As described above, the substrate is introduced into the treatment apparatus without being transferred once. A manufacturing step such as cleaning or substrate treatment can be performed while keeping the state where the substrate 11 is stored by the substrate supplier. It is possible to provide a required amount of substrates for the substrate demander and use efficiently expensive TFT substrates without leaving a stock, since the substrate supplier stores the substrate 11 directly in the container 12.

It is not required to use a container for storing a substrate only that is needed conventionally, and further, an operation for transferring a substrate from the conveying container to a conveying container in the clean room or a container usable for the apparatus can also be skipped according to the above-described manufacturing method. A breakage of a substrate or generation of damages due to an operator's mistake, or generation of electrostatic in transferring can be suppressed by skipping the transferring operation, and thus electrostatic discharge damage of a TFT substrate device or contamination due to particles can be avoided. An operation of the substrate demander for transferring a substrate into a container usable for a treatment apparatus is skipped, and therefore, a throughput is enhanced by performing the simple operation that the container in which a substrate is stored in advance by the substrate supplier is installed in a treatment apparatus by the substrate demander.

A manufacturing method to enhance the throughput by totally-automation and a consistent closed system by which damage of a substrate can be avoided can be realized according to the present invention.

Embodiment Mode 2

Embodiment Mode 1 describes an example of transferring efficiently a substrate by the cooperation between a substrate demander and a substrate supplier. However, Embodiment Mode 2 describes an example of transferring efficiently a substrate by a triangular cooperation (a substrate supplier, a substrate demander, and a container supplier).

FIG. 2 shows a manufacturing method according to the present invention. Reference number 22 denotes a container, 21 denotes a substrate, 23 denotes a transfer robot, 24 denotes a load portion, 25 denotes a treatment chamber of a treatment apparatus, and 26 denotes a substrate to be treated. 27 denotes a container supplier that manufactures a conveying container. 28 denotes a substrate supplier that manufactures substrates such as a TFT substrate and a glass substrate (typically, a glass substrate supplier, a TFT substrate supplier, or the like). 29 denotes a substrate demander that has a treatment apparatus and manufactures a display device (typically, a production plant).

A manufacturing flow of the present invention is described hereinafter. The substrate demander 29 places an order 32 with the substrate supplier 28. The substrate supplier 28 places an order 33 with a container supplier 27 according to the order 32. Note that, the container supplier 27 may be a supplier that manufactures a treatment apparatus so that a container 22 can be arranged in a load portion, and transfers the treatment apparatus to the substrate demander 29. The container supplier 27 manufactures the container 22 according to the order 33. The container 22 is preferably cleaned in the step of manufacturing.

The container 22 is to be installed in the load portion of the apparatus in a later treatment. The container 22 is preferably a container that has a strong light blocking effect, a buffer material for absorbing the shock to a substrate, and a capability of preventing generating of electrostatic. After that, the container supplier 27 (for example, an apparatus supplier) preferably seals a first container so that particles may not be attached to the inside thereof in a clean room, and packs the container 22 with a clean packaging material.

The container 22 packed with the packaging material is transferred from the container supplier 27 to the substrate supplier 28 (the transferring is denoted by 30).

The substrate supplier 28 stores the substrate 21 in the container 22 in a clean room while taking extra care to electrostatic and attachment of particles. After that, the substrate supplier 28 preferably seals the container 22 hermetically so that particles may not be attached to the inside of the container 22 and packs the container 22 so that particles may not be attached to the outside of the container 22 with a clean packaging material in the clean room. The inside of the container is preferably filled with clean air or an inert gas when the container is sealed hermetically. It is noted that the container 22 is preferably cleaned again before the substrate 21 is stored.

The container 22 packed with the packaging material is transferred from the substrate supplier 28 to the substrate demander 29 (the transferring is denoted by 31).

The packaging material of the container is removed in a preparation room and the container is transferred into the clean room. A lid is taken off the container and the container is directly installed in a load portion 24 of the treatment apparatus after the container is transferred into the treatment apparatus. The substrate 21 is taken out of the container 22 by using an arm of the transfer robot 23 of the treatment apparatus after the installing, and the substrate can be installed in a treatment chamber 25.

Then, a treatment such as cleaning is performed on the substrate 26 in the treatment chamber 25.

As described above, the substrate is introduced into the treatment apparatus without being transferred once. A manufacturing step such as cleaning or substrate treatment can be performed while keeping the state where the substrate 21 is stored by the substrate supplier. It is possible to provide a required amount of substrates for the substrate demander and use efficiently expensive TFT substrates without leaving a stock by storing directly the substrate 21 in the container 22 on the substrate supplier's side.

It is not required to use a container for storing a substrate only that is needed conventionally, and further, an operation for transferring a substrate from the conveying container to a conveying container in the clean room or a container usable for the apparatus can also be skipped according to the above-described manufacturing method. A breakage of a substrate or generation of damages due to an operator's mistake, or generation of electrostatic in transferring can be suppressed by skipping the transferring operation, and thus electrostatic discharge damage of a TFT substrate device or contamination of substrates such as a TFT substrate due to particles can be avoided. An operation for transferring a substrate into a container usable for a treatment apparatus is skipped, and therefore, a throughput is enhanced by performing the simple operation that the container in which a substrate is stored in advance is installed in a treatment apparatus by the substrate demander.

A manufacturing method to enhance the throughput by totally-automation and a consistent closed system by which damage of a substrate can be avoided can be realized according to the present invention.

In this embodiment mode, an example that the substrate demander 29 places the order 32 with the substrate supplier 28 is described. However, the substrate supplier 28 may place an order with the container supplier 27.

Embodiment Mode 3

Embodiment Mode 3 describes an example in which a substrate supplier prepares a container, different from that of Embodiment Mode 1.

FIG. 3 shows a manufacturing method according to the present invention. Reference number 42 denotes a used container that is packed with a packaging material in order to avoid being contaminated by isolating the container from air, 41 denotes a substrate, 43 denotes a transfer robot, 44 denotes a load portion of a treatment apparatus, 45 denotes a treatment chamber of the treatment apparatus, 46 denotes a substrate to be treated in FIG. 3. 47 denotes a substrate supplier that manufactures substrates such as a TFT substrate and a glass substrate (typically, a glass substrate supplier, a TFT substrate supplier, or the like). 48 denotes a substrate demander that has a treatment apparatus and manufactures a display device (typically, a production plant).

The substrate demander 48 prepares or manufactures the container 42. The container 42 is preferably cleaned in the step of manufacturing the container.

The container 42 is transferred from the substrate demander 48 to the substrate supplier 47 (the transferring is denoted by 40). The container 42 is hermetically sealed so that extra particles may not be attached to the inside or outside of the container 42. After that, the container 42 packed with a clean packaging material is preferably transferred (the transferring is denoted by 40). The transferring 40 doubles as an order. The substrate supplier 47 receives the transferring and then, stores the substrate in the container 42 in a clean room depending on the number of the received containers while taking extra care to electrostatic discharge damage of a substrate and mixing of particles. After that, the substrate supplier 47 preferably seals the container 42 hermetically so that the inside of the container 42 may not be contaminated and packs the container 42 so that particles may not be attached to the outside of the container with a clean packaging material in the clean room. The inside of the container 42 is preferably filled with clean air or an inert gas when the container is sealed hermetically. It is noted that the container 42 is preferably cleaned again before the substrate 41 is stored. The container 42 packed with the packaging material is transferred from the substrate supplier 47 to the substrate demander 48 (the transferring is denoted by 49).

The packaging material of the container is removed in a preparation room and the container is transferred into the clean room. The lid of the container is taken off the container and the container is directly installed in a load portion 44 of the treatment apparatus after the container is transferred into the treatment apparatus. The substrate 41 is taken out of the container 42 by using a robot arm 43 of the load portion of the treatment apparatus after the installing, and the substrate can be installed in a treatment chamber 45.

Then, a treatment such as cleaning is performed on the substrate 46 in the treatment chamber 45.

As described above, the substrate is introduced into the treatment apparatus without being transferred once. A manufacturing step such as cleaning or substrate treatment can be performed while keeping the state where the substrate 41 is stored by the substrate supplier. It is possible to provide a required amount of substrates for the substrate demander and use efficiently expensive TFT substrates without leaving a stock by storing directly the substrate 41 in the container 42 on the substrate supplier's side.

Embodiment Mode 4

An example that is partially different from that in Embodiment Mode 2 is described in Embodiment Mode 4. The same reference numbers are used for the same portions as those in Embodiment Mode 2, except for different portions.

Figure 4:
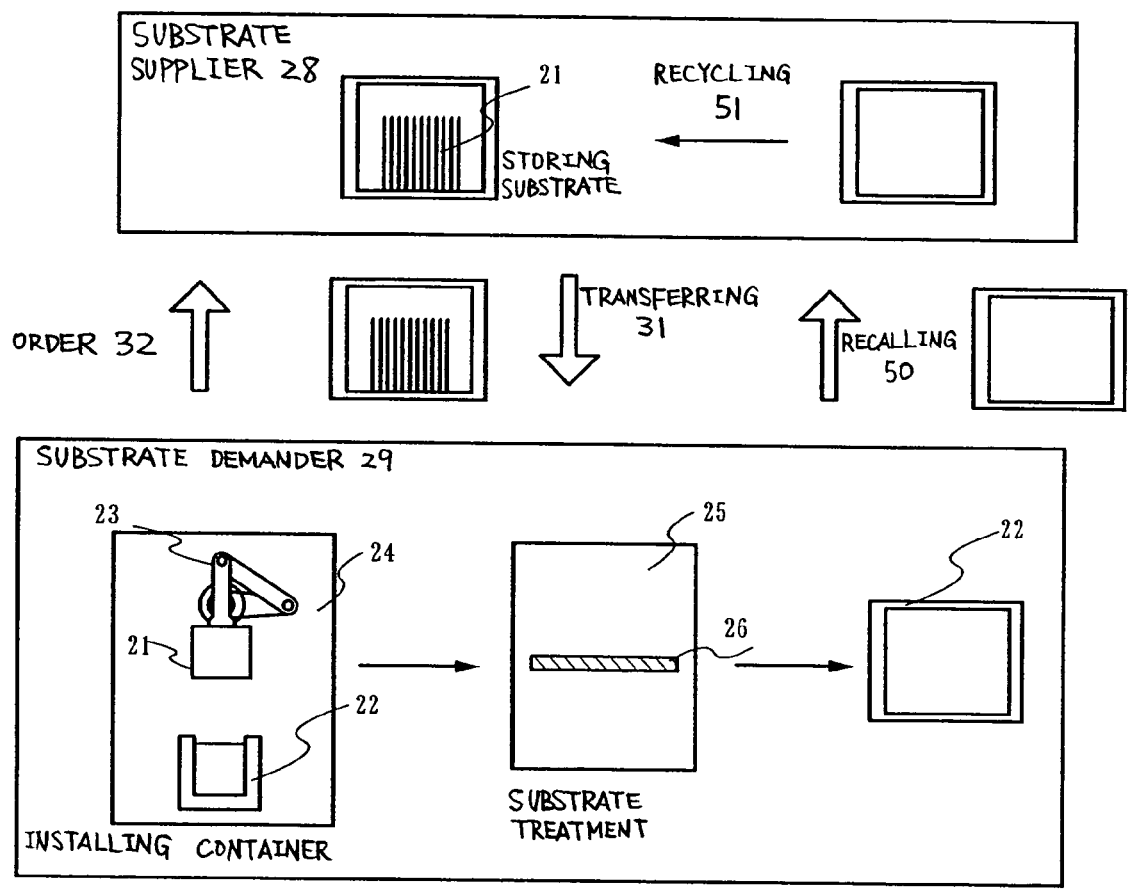
FIG. 4 shows Embodiment Mode 4.

FIG. 4 shows a manufacturing method according to the present invention. A container 22 is empty, since all substrates are used. A method by which the container 22 is recalled without being contaminated by a substrate supplier 28 and the container 22 is recycled is described in this embodiment mode (the recalling is denoted by 50 and the recycling is denoted by 51).

A manufacturing flow until a substrate 26 that is treated is obtained according to the present invention is the same as that of Embodiment Mode 2, and thus omitted here.

The used container is useless after the treated substrate 26 is obtained.

The container 22 is taken out of a treatment apparatus and recalled 50 by the substrate supplier 28 as shown in FIG. 4 in this embodiment mode. The container is preferably cleaned again and used again. Before the cleaning, contamination of the container due to particles or the like is preferably prevented. Accordingly, the container is preferably sealed hermetically in a clean room after the container is taken out. Further, the container 22 that is packed with a clean packaging material is preferably recalled 50 in order to prevent contamination from outside.

As described above, the container 22 is recalled by the substrate supplier, and thus, waste of resources is reduced, and resources can be used efficiently, and recycled.

This embodiment mode can be combined freely with any one of Embodiment Modes 1 to 3.

Embodiment Mode 5

Embodiment Mode 5 describes a method for transferring substrates that are different in size with reference to FIG. 5.

Reference number 62 denotes a container, 60 denotes a substrate holder in the container, 61 denotes a substrate, 63 denotes a transfer robot, 64 denotes a load portion of a treatment apparatus, 65 denotes a treatment portion of a treatment apparatus, 66 denotes a substrate to be treated. 67 denotes a substrate supplier that manufactures substrates such as a TFT substrate and a glass substrate (typically, a glass substrate supplier, a TFT substrate supplier, or the like). 68 denotes a substrate demander that has a treatment apparatus and manufactures a display device (typically, a production plant).

A manufacturing flow of the present invention is described hereinafter.

The substrate is manufactured by the substrate supplier 67. Then, a substrate holder in the container 62 is replaced by the substrate supplier 67 into a substrate holder 60 corresponding to the size and kind of the substrate 61 that is designated by the substrate demander 68.

The substrate 61 is stored by the substrate supplier 67 in the container 62 that is designated by the substrate demander 68. The container 62 is a container that can be installed in the load portion of the treatment apparatus, typically, a substrate cassette box.

The container 62 in which the substrate 61 is stored is transferred to the substrate demander 68 and installed in the load portion 64 of the treatment apparatus (the transferring is denoted by 70).

Then, the substrate 61 is transferred into the treatment portion 65 of the treatment apparatus by the transfer robot 63 of the load portion.

A substrate treatment such as cleaning is performed on the substrate 66 in the treatment chamber 65.

As described above, it is possible to transfer the substrate 61 to meet an order 69 of the substrate demander 68 with the same container 62 by providing the substrate holder 60 of the container 62 on the substrate supplier's side 67, even if the size of the substrate 61 is changed. Thus, the container 62 can be used efficiently The present embodiment mode can be combined freely with any one of Embodiment Modes 1 to 4.

Embodiment Mode 6

Embodiment Mode 6 shows an example that is partially different from that of Embodiment Mode 5. The same reference numbers are used for the same portions as those in Embodiment Mode 5, except for different portions.

FIG. 6 shows a manufacturing method according to the present invention.

A container 62 is empty in FIG. 6, since all substrates are used. A method by which the container 62 is recalled by a substrate supplier 67 without being contaminated and the container 62 is recycled is described in this embodiment mode (the recalling is denoted by 71).

A manufacturing flow until a substrate 66 that is treated is obtained of the present invention is the same as that of Embodiment Mode 5, and thus omitted here.

The used container is useless after the substrate to be treated 66 is obtained.

The container 62 is taken out of a treatment apparatus and recalled 71 by the substrate supplier 67 as shown in FIG. 6 in this embodiment mode.

Then, the substrate holder 60 of the container 61 is replaced depending on a substrate ordered by the substrate demander 68. The container is preferably cleaned again and used again. Before the cleaning, contamination of the container due to particles or the like is preferably prevented. Accordingly, the container is preferably sealed hermetically in a clean room after the container is taken out. Further, the container 62 that is packed with a clean packaging material is preferably recalled in order to prevent contamination from outside (the recalling is denoted by 71).

As described above, the substrate holder 60 of the container 62 is replaced by the substrate supplier 67, and therefore, the substrate 61 filling the order of the substrate demander 68 can be transferred with the same container 62. It is possible to use efficiently the container 62 and recycle the container 62.

This embodiment mode can be combined freely with any one of Embodiment Modes 1 to 5.

The present invention comprising the above-described structures is described in details with reference to Embodiment 1 described hereinafter.

Embodiment

Embodiment 1

Figure 7:
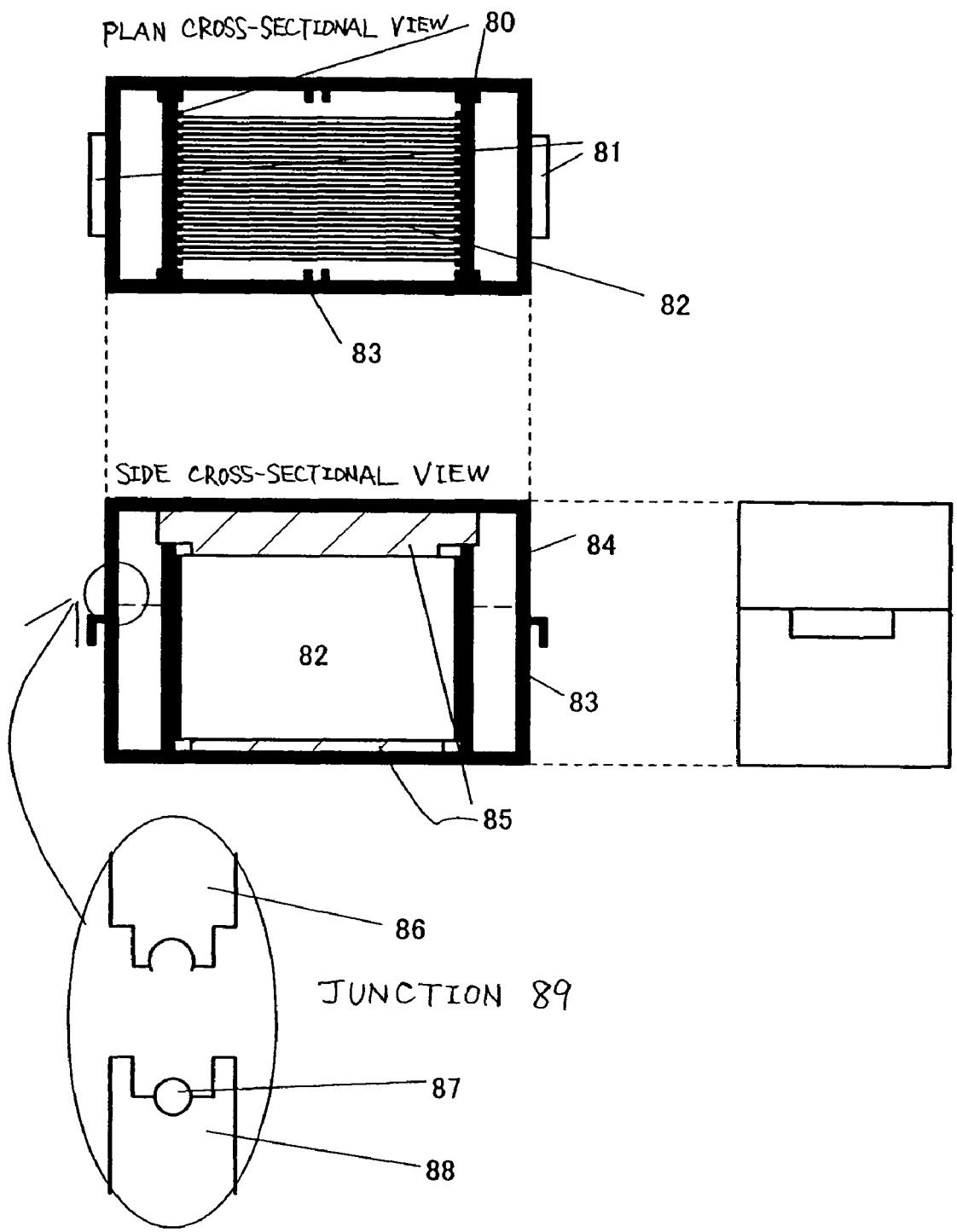
FIG. 7 shows Embodiment 1.

FIG. 7 shows an example of containers described in Embodiment Modes 1 to 7 in this embodiment.

FIG. 7 is a cross-sectional view and outline view of a container in which a substrate is stored.

In FIG. 7, reference number 83 denotes a container, typically a cassette box, in which a substrate 82 is stored. The container 83 can be sealed hermetically with a container lid 84. The container 83 is provided with a handle 81 to be carried easily by an operator. The container 83 is provided with a substrate holder 80 and a junction 89 in addition to the main body. The substrate holder 80 can be removable from the main body of the container, and replaceable depending on the size of the substrate 82. The substrate holder 80 is formed from a conductive substance such as metal, or conductive polymer, or a surface thereof formed with an insulating substance such as plastic or a semiconductor substance is coated with a conductive material such as metallic powder, metal thin film, or conductive polymer in order to prevent the substrate 82 from being charged by electrostatic. The junction 89 for containers includes a junction 86 for a container lid, a junction 88 for containers and a sealing material 87, and is used to hermetically seal the junction 86 for a container lid and the junction 88 for containers by an O-ring 87 or the like.

The container is formed from a reinforced plastic, metal, or the like in order to have an light blocking effect and a shock resistance, and a surface of the container is coated with a conductive substance as an electrostatic-protection in the case where the material of the container is not conductive.

A shock absorbing material 85 that is conductive or coated with a conductive substance is provided for the container lid 84 and the container 83 in order to suppress moving of a substrate, electric charging of the substrate, and absorb shock on the substrate in transferring.

The inside of the container 83 is filled with an inert gas (typically, nitrogen) or the container lid 84 is sealed hermetically to keep the inside an atmosphere of a clean room in the atmosphere of the clean room.

Figure 8:
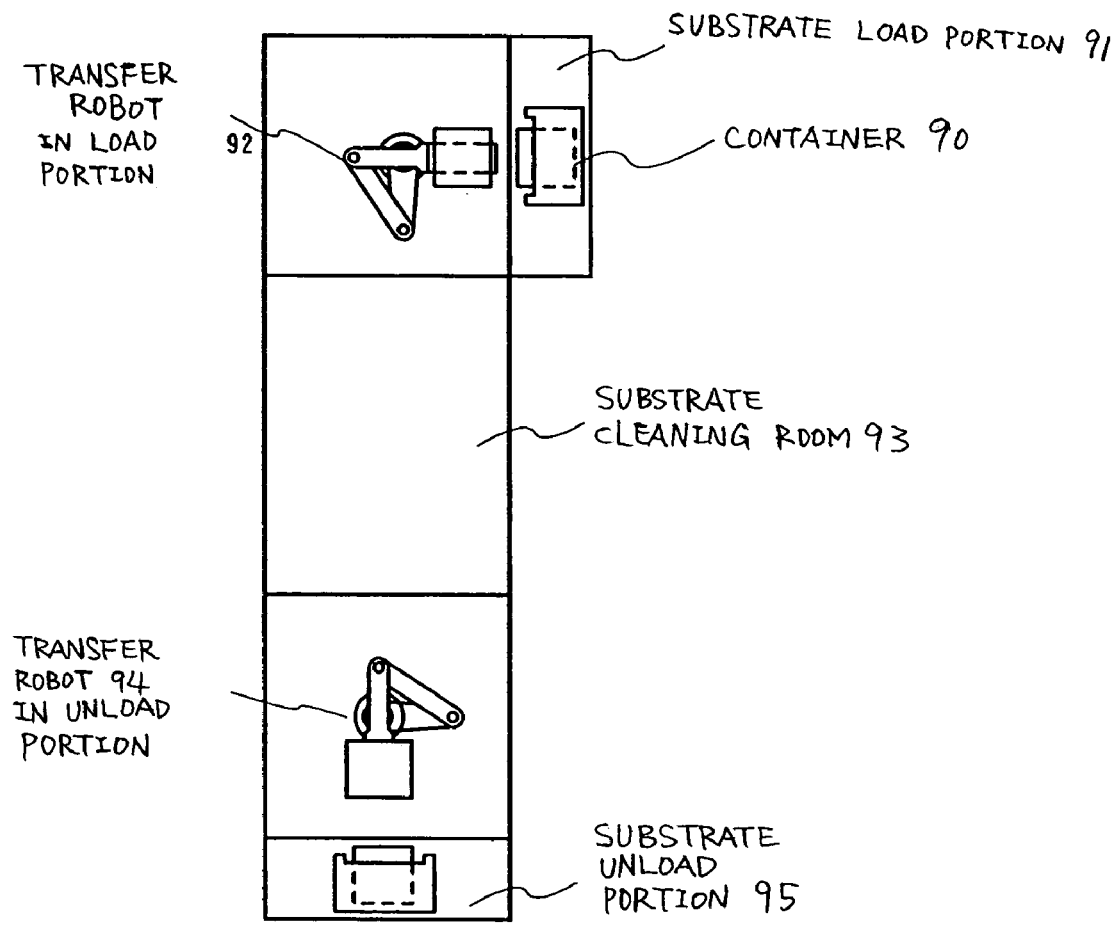
FIG. 8 shows a treatment apparatus (Embodiment 1).

The container lid is removed and then, the container 90 is installed in the load portion 91 of the treatment apparatus (typically, substrate cleaning apparatus) shown in FIG. 8. The substrate inside the container is taken out by a transfer robot 92, and transferred into a cleaning room 93. The treated substrate is stored in a cassette box provided for an unload portion 95 by a transfer robot 94 of the unload portion 95. It is possible to install the container in the treatment apparatus with the lid on and remove the container lid by the robot, by adding a function of removing the lid to the transfer robot 92.

The present embodiment can be freely combined with any one of Embodiment Modes 1 to 6.

According to the manufacturing method of the present invention, a plurality of substrates can be transferred with one container, and installed in a treatment apparatus, wasteful steps is eliminated, and thus environmentally-friendly step can be obtained. Since the substrate supplier installs directly a substrate in a container, it is possible to sell a required amount of substrates, and use efficiently a glass substrate, a TFT substrate or the like that is relatively expensive. In other words, it is possible to eliminate excess stock of unnecessary substrates or shortage of substrates generated in a conventional way. The present invention makes it possible to transfer a TFT substrate, although the TFT substrate cannot be transferred by a conventional method.

The operation for transferring a substrate into a conveying container in a clean room or a container usable for an apparatus from the conveying container can be skipped according to the manufacturing method of the present invention. The operation for transferring is skipped, and therefore, damages or breakage of a substrate due to an operator's mistake in transferring can be suppressed, and generating electrostatic in transferring can be avoided, thereby eliminating electrostatic discharge damage of a TFT substrate device or contamination of a substrate such as a TFT substrate due to particles. An operation for transferring a substrate into a container usable for a manufacturing apparatus is skipped, and therefore, a throughput is enhanced by performing the simple operation that the container in which a substrate is stored in advance is installed in a treatment apparatus by the substrate demander.

According to the present invention, a manufacturing method for improving the throughput by being automated is realized. Further, a consistent closed system that is capable of preventing a substrate from being damaged can be realized.

Even if the substrate supplier provides a TFT substrate or the like that has no defects in a clean state, there is a risk of electrostatic discharge damage of a TFT substrate device or contamination of a substrate due to particles as long as a conventional operation for transferring is performed by a substrate demander. And performance of a TFT substrate or a clean state of a substrate cannot be kept, and there is a limitation of the performance or keeping a quality. According to the present invention, the substrate supplier and the substrate demander try in cooperation to avoid mixing of particles and generating of electrostatic, thereby keeping a TFT substrate device with a very high performance and a substrate state with a high quality, and manufacturing can be performed without detracting from the performance and the quality.

What is claimed is:

1. A manufacturing method comprising:
    transferring a container with a first substrate holder provided in the container from a container supplier to a substrate supplier that sells a substrate provided with a TFT;
    manufacturing the substrate provided with the TFT by the substrate supplier;
    replacing the first substrate holder by a second substrate holder to provide the second substrate holder in the container depending on a size of the substrate in the substrate supplier;
    storing the substrate in the container in an atmosphere where electrostatic is eliminated by an ionizer in the substrate supplier by holding the substrate by the second substrate holder;
    transferring the container to a production plant from the substrate supplier;
    installing the container in a treatment apparatus in the production plant to introduce the substrate into the treatment apparatus in the production plant; and
    performing a treatment on the substrate in the treatment apparatus in the production plant,
    wherein the substrate supplier is outside the production plant,
    wherein the second substrate holder has a different size than the first substrate holder, and wherein the container that has been used at the production plant is recalled and recycled by the substrate supplier.

2. A method according to claim 1,
wherein the treatment apparatus includes one treatment chamber or a plurality of chambers, a load portion for taking the substrate out of the container, and an unload portion for storing the substrate on which the treatment has been performed.

3. A method according to claim 1,
wherein the container is a cassette box.

4. A method according to claim 1,
wherein the container can be sealed hermetically with a lid attached to the container.

5. A method according to claim 1,
wherein the container has a light-blocking effect.

6. A method according to claim 1,
wherein the container is electrostatic-protected.

7. A method according to claim 1,
wherein the container includes a shock absorbing material.

8. A method according to claim 1,
wherein the container is cleaned by the substrate supplier.

9. A method according to claim 1,
wherein the treatment apparatus is a substrate cleaning apparatus.

10. A method according to claim 1,
wherein the treatment apparatus is a vacuum deposition apparatus including at least one vacuum chamber.

11. A method according to claim 1,
wherein the treatment apparatus is a chemical vapor deposition (CVD) apparatus.

12. A method according to claim 1,
wherein the treatment apparatus is an UV treatment apparatus.

13. A method according to claim 1,
wherein the treatment apparatus is a scriber and breaker apparatus.

14. A method according to claim 1,
wherein the treatment apparatus is a sputtering apparatus.

15. A method according to claim 1,
wherein the treatment apparatus is a furnace.

16. A method according to claim 1,
wherein the treatment apparatus is a laser marking apparatus.

17. A method according to claim 1,
wherein the treatment apparatus is a substrate profiling apparatus including an optical microscope.

18. A method according to claim 1,
wherein the container and a lid covering the container are arranged to be hermetically sealed to store the substrate in the container covered with the lid, and the lid is removed, and the container is introduced into the load portion of the treatment apparatus, the substrate is taken out of the container and arranged, and after that, the treatment is performed on the substrate in a treatment portion of the treatment apparatus.

19. A manufacturing method comprising:
manufacturing a substrate provided with a TFT by a substrate supplier that sells the substrate provided with the TFT;
replacing a first substrate holder provided in a container by a second substrate holder to provide the second substrate holder in the container depending on a size of the substrate in the substrate supplier;
storing the substrate in the container in an atmosphere where electrostatic is eliminated by an ionizer in the substrate supplier by holding the substrate by the second substrate holder;
transferring the container to a production plant from the substrate supplier;
installing the container in a treatment apparatus in the production plant to introduce the substrate into the treatment apparatus in the production plant; and
performing a treatment on the substrate in the treatment apparatus in the production plant,
wherein the substrate supplier is outside the production plant,
wherein the second substrate holder has a different size than the first substrate holder, and wherein the container that has been used at the production plant is recalled and recycled by the substrate supplier.

20. A method according to claim 19,
wherein the treatment apparatus includes one treatment chamber or a plurality of chambers, a load portion for taking the substrate out of the container, and an unload portion for storing the substrate on which the treatment has been performed.

21. A method according to claim 19,
wherein the container is a cassette box.

22. A method according to claim 19,
wherein the container can be sealed hermetically with a lid attached to the container.

23. A method according to claim 19,
wherein the container has a light-blocking effect.

24. A method according to claim 19,
wherein the container is electrostatic-protected.

25. A method according to claim 19,
wherein the container includes a shock absorbing material.

26. A method according to claim 19,
wherein the container is cleaned by the substrate supplier.

27. A method according to claim 19,
wherein the treatment apparatus is a substrate cleaning apparatus.

28. A method according to claim 19,
wherein the container and a lid covering the container are arranged to be hermetically sealed to store the substrate in the container covered with the lid, and the lid is removed, and the container is introduced into the load portion of the treatment apparatus, the substrate is taken out of the container and arranged, and after that, the treatment is performed on the substrate in a treatment portion of the treatment apparatus.

* * * * *